United States Patent [19]

Blankenship et al.

[11] Patent Number: 4,733,168

[45] Date of Patent: Mar. 22, 1988

[54] TEST ENABLING CIRCUIT FOR ENABLING OVERHEAD TEST CIRCUITRY IN PROGRAMMABLE DEVICES

[75] Inventors: Timothy L. Blankenship, Palm Bay, Fla.; Joseph G. Nolan, III, San Jose, Calif.

[73] Assignee: Harris Corporation, Melbourne, Fla.

[21] Appl. No.: 842,272

[22] Filed: Mar. 21, 1986

[51] Int. Cl.⁴ ............................................. G01R 15/12
[52] U.S. Cl. .............................. 324/73 R; 324/158 R; 324/110
[58] Field of Search .............. 307/261, 264, 290, 360, 307/361, 350, 351, 540, 567, 581, 585; 324/73 R, 73 PC, 158 R, 158 T, 73 RT, 110; 361/56, 91, 111

[56] References Cited

U.S. PATENT DOCUMENTS

| | | | |
|---|---|---|---|
| 4,032,795 | 6/1977 | Hale | 307/264 |
| 4,163,907 | 8/1979 | Schroeder et al. | |
| 4,229,670 | 10/1980 | Thommen et al. | 307/360 |
| 4,274,014 | 6/1981 | Schade, Jr. | 307/585 |
| 4,293,782 | 10/1981 | Tanaka et al. | 307/350 |
| 4,322,639 | 3/1982 | Yamashiro | 307/350 |
| 4,336,495 | 6/1982 | Happe | 324/158 T |
| 4,398,146 | 8/1983 | Draheim et al. | 324/73 PC |
| 4,449,158 | 5/1984 | Taira | 361/91 |
| 4,495,628 | 1/1985 | Zasio | 324/73 AT |
| 4,567,388 | 1/1986 | Jarrett et al. | 307/540 |
| 4,626,713 | 12/1986 | Lee | 307/351 |
| 4,630,162 | 12/1986 | Bell et al. | 361/111 |

FOREIGN PATENT DOCUMENTS

| | | | |
|---|---|---|---|
| 0021472 | 1/1981 | European Pat. Off. | 361/111 |
| 2045566 | 10/1980 | United Kingdom | 307/290 |

*Primary Examiner*—Reinhard J. Eisenzopf
*Assistant Examiner*—W. Burns
*Attorney, Agent, or Firm*—Barnes & Thornburg

[57] ABSTRACT

A test enabling circuit for actuating specific testing circuitry contained within a programmable device, whereby the test enabling circuit and a portion of the normal operational circuits of the device share a common input pin. Because of the dual functionality of the common input pin, the test enabling circuit is designed to respond to a specified test signal, which is either of an opposing polarity, or of a higher magnitude of the same polarity with respect to the normal operational signal. The enabling circuit includes several IGFET devices arranged such that the noise margin of the enabling circuit may be adapted for accommodating varying environments of noise. ESD circuitry is included to protect the testing and test enabling circuits against electrostatic discharge.

18 Claims, 2 Drawing Figures

TEST ENABLING CIRCUIT FOR ENABLING OVERHEAD TEST CIRCUITRY IN PROGRAMMABLE DEVICES

BACKGROUND AND SUMMARY OF THE INVENTION

The present invention relates generally to test enabling circuitry for testing circuits, and more specifically to a test enabling circuit for enabling testing circuitry in programable memory devices.

Generally, programmable memory devices include testing circuitry within the device for performing various tests prior to shipping the device out for sale. Various testing circuitry include testing for speed, decoder functionality and programmability, in addition to fuse resistance testing for fuse link programmable devices. A test enabling circuitry is included in the device for activating this testing circuitry.

Because of the maximum utilization of the pins connected to normal operational circuitry in a memory device, several pins are used for dual functions, such as where a pin is connected internally to both a part of the memory circuitry of the device and a part of the testing circuitry. In complementary insulated gate field effect transistors having P wells in an N substrate as that used in some PROMs and PALs, a positive input applied to the input pins will initiate normal operations of the memory device. Therefore, the testing circuitry would necessarily be designed such that it is enabled by a negative voltage applied at the corresponding input.

U.S. Pat. No. 4,163,907 to Schroeder et al. describes input buffers having a single input and a pair of outputs for providing three logic output states. A single FET in a common gate configuration is arranged in between the input and one of the outputs. Connected between the drain of this FET and a power source is a resistor having a ratio of impedance with the FET such that the FET will conduct when the input voltage is at a specified voltage below the threshold of the FET.

The present invention improves upon the Schroeder invention by increasing the noise margin for a testing circuitry and improving upon the electrostatic discharge protection of the circuit, whereby these improvements assure that the testing circuitry will not be inadvertently activated by external noise or discharge.

It is, therefore, an object of this invention to provide an improved test enabling circuit for programmable devices having insulated gate field effect transistors for the overhead testing circuitry.

It is further an object of this invention to provide an improved test enabling circuit having sufficient noise margin capabilities such that the testing circuitry will only be enabled upon the device receiving a specified test signal.

It is another object of the invention to provide an improved test enabling circuit which allows for selection of the voltage input required for enabling the testing circuitry.

These and other objects are attained by providing a test enabling circuit connected with a portion of the normal operating circuit at a common input pin. The test enabling circuit includes both a negative input circuit and an interfacing circuit, with the negative input circuit further including a voltage divider circuit and a voltage clamping circuit. The voltage divider includes a resistive means which is coupled between a common voltage supply and a common nodal point for providing a specified potential at the nodal point when operational signals are applied to the common input pin. The divider also includes a plurality of field effect devices which are connected between the common nodal point and the common input pin, whereby the field effect devices impose a second specified potential at the nodal point when test signals are applied to the input pin. The interfacing circuit, is connected between the common nodal point and the testing circuitry, whereby the interfacing circuit provides either a disabling or enabling signal for the testing circuitry in response to either the first or second specified potential which is present at the nodal point. Additionally, the voltage clamping circuit is connected to the common nodal point for clamping the nodal point to a specified voltage, thereby protecting the other devices connected to the common nodal point from excessive potential.

The input stage to the normal operational circuit of the programmable device provides electrostatic discharge (ESD) protection for the operational circuitry. The ESD stage directs ESD to either the power supply or to ground depending upon the ESD polarity, thereby diverting any excessive potential and current from reaching the normal operational circuit.

Other objects, advantages and novel features of the present invention will become apparent from the following detailed description of the invention when considered in conjunction with the accompanying drawings.

DETAILED DESCRIPTION OF THE DRAWINGS

Figure 1:
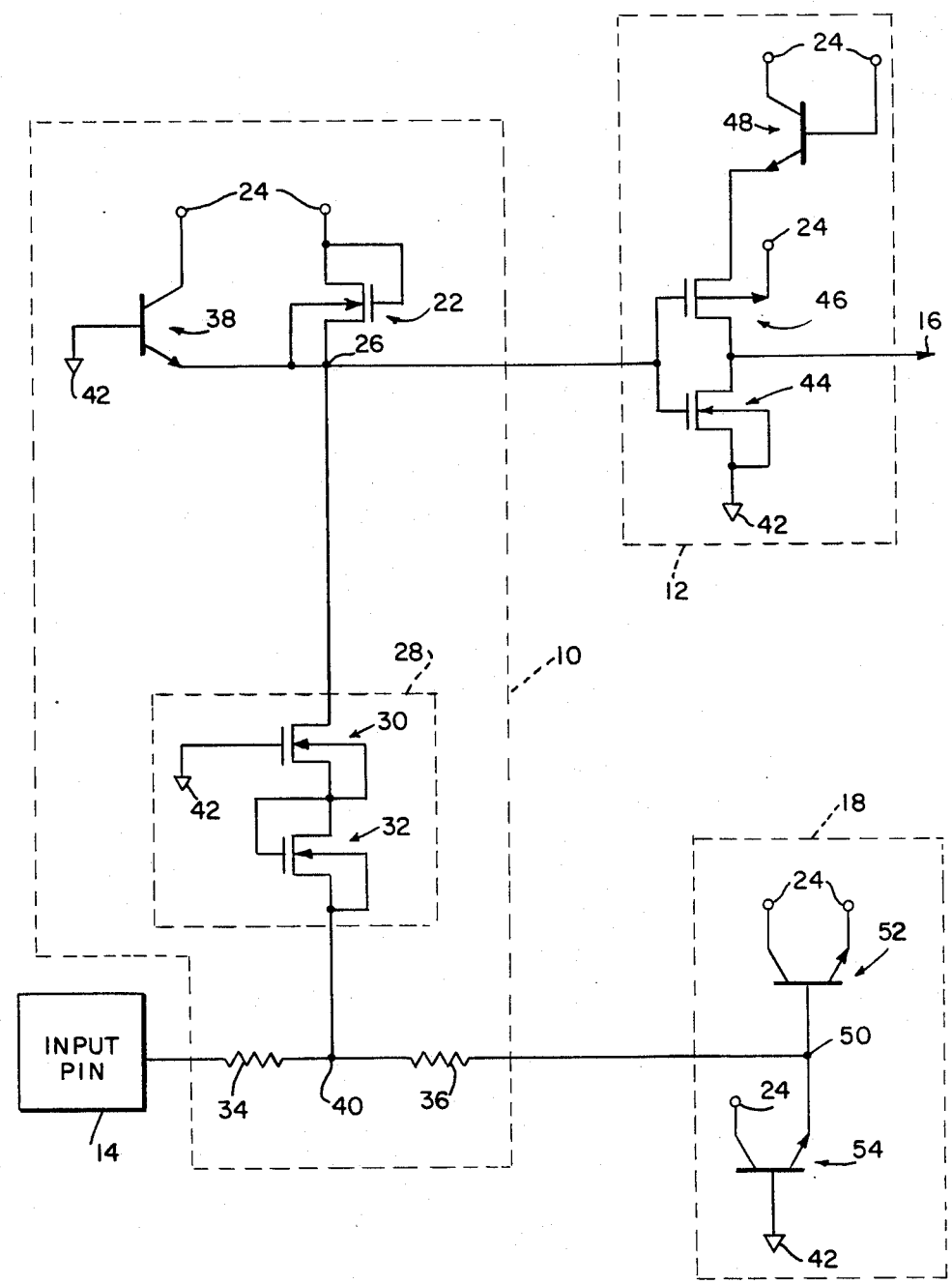
FIG. 1 represents a schematic diagram of the test enabling circuit incorporating the principles of the present invention.

Referring to FIG. 1, a preferred embodiment shows an enabling test circuit for N substrate memory type device in which a negative voltage input is used for enabling the testing circuitry. The circuit, however, can be implemented with P substrate devices whereby a "super" positive voltage would be required for its activation. The test enabling circuit of FIG. 1 consists of a negative input enabling circuit 10 and an inverting circuit 12 connected between a common input 14 and the testing circuitry input at 16. Input pin 14 is also connected to a standard input stage for a normal operational memory device which in the preferred embodiment includes an electrostatic protection discharge stage 18.

When a positive potential which is equivalent to the normal operational signal is applied to the input 14, the negative input circuit 10 is biased to provide a positive potential at the input of the inverting circuit 12. This results in the inverting circuit 12 providing a disabling signal to the testing circuitry at 16. The normal operating circuit, however, is activated in this mode. When a negative input potential, which is equivalent to the test signal, is applied to the input 14, the normal operational circuit becomes inactive. The negative input circuit 10, however, is biased to provide a signal to the input of the inverting circuit which approximates ground potential due to a clamping circuit 38. This results in the inverting circuit 12 providing an enabling signal to the testing circuitry, thereby allowing for the various tests of the testing circuitry to be performed while the normal operational circuit is inactive.

The negative input circuit includes a resistance means 22 and a plurality of field effect devices 28 forming a voltage divider 10 having a node 26 positioned therebetween. The potential provided at this node 26 serves as the input signal to the inverting means 12, with this signal being clamped by a clamping circuit 38.

The plurality of field effect devices 28, may comprise a pair of N-channel MOS devices which serve both as part of the divider and as an actuator for the test enabling circuit. The N-channel devices are connected in series with the drain of the first N-channel device 30 connected to node 26, the gate connected to ground potential 42 and the source connected to both the drain and gate of the second N-channel device 32. The source of the second device 32 is connected to a node 40 which is in turn connected to the input 14 by a resistor 34.

The resistance means 22, illustrated as an N-channel MOS device, has its drain and gate connected to the power supply 24 and its gate and substrate connected to node 26. This N-channel device provides a voltage drop between the power supply 24 and the node 26 when the switching means has been actuated as a result of a test signal being applied to the input 14. The clamping circuit is illustrated by an NPN transistor 38 having its collector connected to the power supply 24, its base to ground potential 42 and its emitter to node 26.

The inverter circuit 12, which provides the enabling and disabling signals to the testing circuitry at 16, is illustrated by a complementary pair of metal oxide transistors, one P-channel 46 and the other N-channel 44. The gates of the two MOS devices are coupled to each other and to the node 26. The source of the P-channel device 46 is connected to the emitter of an NPN transistor 48. The NPN transistor 48 provides a voltage drop of one $V_{BE}$ from the power supply to the source of the P-channel device 46. The source of the N-channel device 44 is connected to ground potential 42. The drains to the P and N channel devices are coupled to each other and provide the inverter output at 16 which in turn leads to the testing circuitry which is not shown. The NPN transistor 48 has both its collector and its base connected to the power supply 24, thereby forming the diode which introduces a voltage drop to provide CMOS voltage levels to the output 16.

The input stage 18 to the normal operational circuit of the programmable device provides electrostatic discharge (ESD) protection for the operational circuitry to the right of node 50. The ESD stage which directs ESD to the power supply 24 or to ground 42, depending upon the ESD polarity, is illustrated by NPN transistors 52 and 54. Transistor 52 has both its collector and emitter connected to the power supply 24. The base of transistor 52 is connected to the emitter of transistor 54 and to node 40 via a resistance 36. The collector of resistor 54 is connected to the power supply 24 with its base connected to ground potential 42.

In the operation of the test enabling circuit, when a positive potential is applied to the input representing a normal operational signal, the test enabling device will be inactive. Because of the positive potential at node 40, the stacked N-channels 28 will not conduct, thereby providing no current path for the N-channel device 22. This results in the positive potential of the power supply 24 to be reflected across N-channel device 22 to node 26. This positive potential at node 26 serves as the input to the inverter 12, thereby biasing the P channel 46 of the inverter to be off and the N-channel 44 to be on, resulting in a "low" output equivalent to approximately ground potential at 16, thereby disabling the testing circuitry.

When a test signal of approximately −5 volts is applied at the input pin 14, the stacked N-channel devices 28 will be biased on, thereby providing a current path for the N-channel device 22. This results in the potential at node 26 being pulled down to approximately ground potential as the voltage is dropped across the N-channel device 22, thereby biasing the P-channel device 46 of the inverter to be on and the N-channel device 44 to be off. A "high" output at 16 equivalent to approximately +5 volts occurs, which enables the testing circuitry. Should the voltage at the node 26 be pulled below ground potential, the clamping circuit 38 will clamp the voltage to no less than one $V_{BE}$ below ground potential. In addition to providing clamping, the circuit 38, also provides electrostatic discharge protection for the negative input circuit 10 should a negative ESD be applied to the input 14 which is greater than −5 volts.

By stacking more N-channel devices at the input of the testing circuit, the voltage level of actuating the test enabling circuit may be increased, thereby expanding the noise margin of the enabling circuit. This allows for a memory device to be used in an environment suspected of having a higher potential for ESD. By merely adding more N-channels, the noise margin is raised to a level which will prevent the ESD from activating the test enabling circuit.

Additionally, the input stage 18 of the normal operational circuit include transistors 52 and 54 for providing electrostatic discharge protection devices. Depending upon the polarity of the ESD, one or the other transistor will conduct, thereby providing a path away from the normal, operational circuit for ESD. Should a positive ESD be applied to the input pin 14 which thereby produces at the node 50 a potential equal to or greater than the power supply plus a $V_{BE}$, transistor 52 will turn on to provide a sink for the positive ESD. Similarly with a negative ESD applied at the input pin which produces a potential at node 50 equal to or greater than ground potential less a $V_{BE}$, transistor 54 will turn on to provide a sink for the negative ESD.

The inclusion of ESD protection requires special consideration at the input pin 14 to accommodate the device when under testing conditions. Because current will be pulled out through the base-emitter junction of transistor 54 as the input signal becomes sufficiently negative by application of the test signal, resistor 36 must be chosen correspondingly larger than resistor 34 such that the test enabling circuit will operate properly in response to the test signal. In the preferred embodiment, the resistance values are approximately 350 ohms and 450 ohms for $R_{34}$ and $R_{36}$ respectively.

Figure 2:
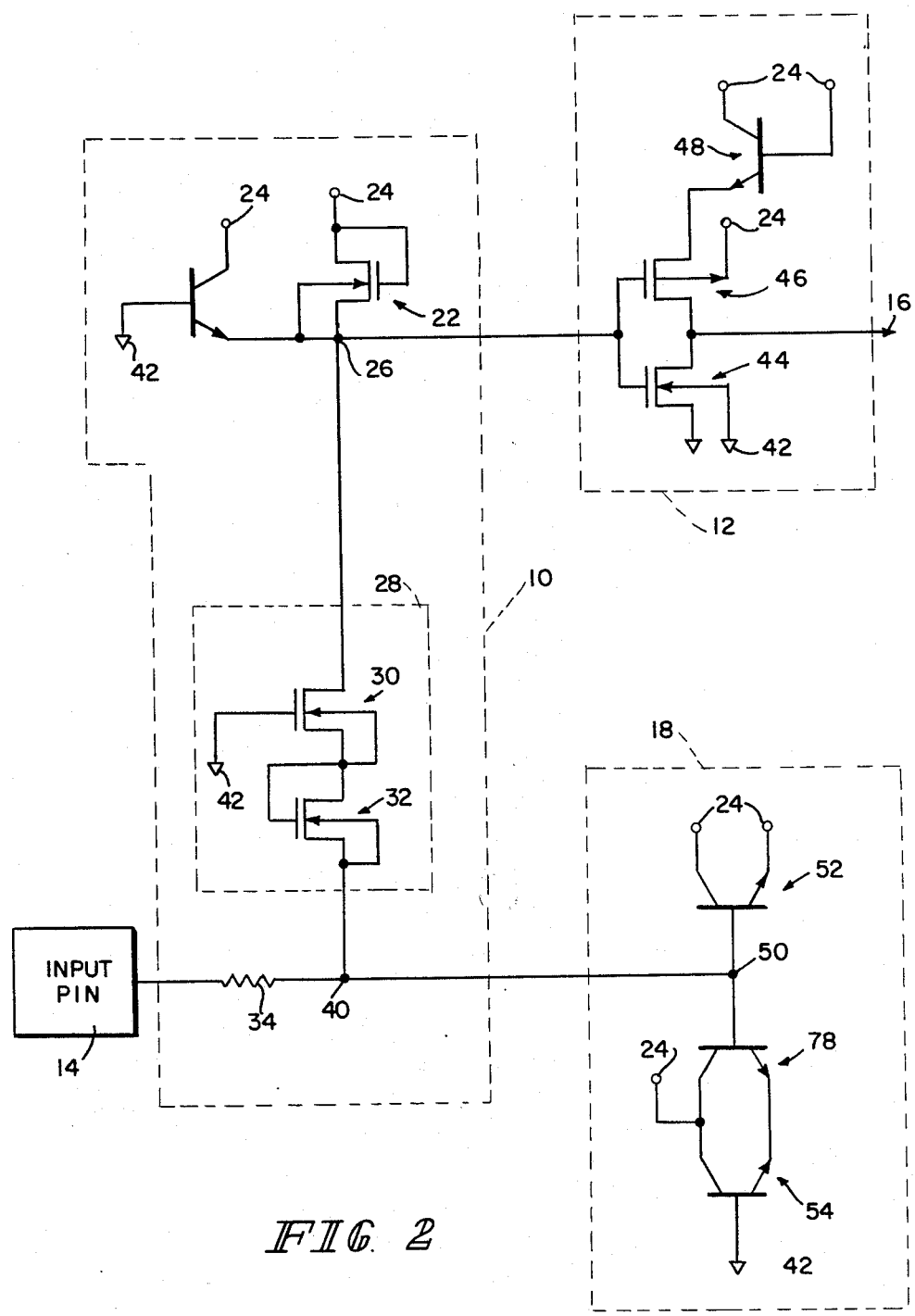
FIG. 2 represents a schematic diagram of another embodiment of the test enabling circuit.

In the preferred embodiment of FIG. 2, resistor 36 is replaced by a vertical NPN transistor 78 having a P+/N+ base-emitter junction. This type of junction forms a zener diode with a breakdown of approximately −4.5 volts. Therefore, a voltage of at least −4.5 volts plus $V_{BE}$ a must be applied to the input pin 14 before any current will be pulled out of transistor 54. Thus the stacked N-channels 28 will respond to the test signal being applied to the input 14 without excessive current being pulled out of transistor 54 during the testing mode of operation. In this embodiment, the resistance value for $R_{34}$ is approximately 800 ohms.

In this configuration, the collector of transistor 78 is connected to power supply 24, its base to ground potential 42 and its emitter to the emitter of transistor 54. Because of the introduction of the zener diode, the normal operational circuit will not have the negative ESD protection in the range of 0 to −4.5 that it would otherwise have using the first embodiment.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. In a programmable memory device having a testing circuit, a test enabling circuit connected to said testing circuit, and an input means for receiving a test signal and a normal operational signal, said testing circuit and a normal operational circuit connected at a common node to said input means, wherein said improvement is said test enabling circuit which comprises:
   a resistance means connected between a power supply and a nodal point for providing a first signal to said nodal point when said input means receives said operational signal;
   a plurality of insulated gate field effect transistors connected between said nodal point and said input means for imposing a second signal to said nodal point when said input means receives a single said test signal;
   a clamping means connected to said nodal point for preventing said second signal from exceeding a specified potential; and
   an interfacing means connected between said nodal point and said test circuit for providing a disable and an enable signal for said test circuit in response to said first and second signals, respectively.

2. The test enabling circuit of claim 1, wherein said resistance means includes an N-channel insulated gate field effect transistor having its drain connected to said power supply and its gate and source connected to said nodal point for providing a voltage drop between said supply and nodal point when said input means receives said test signal.

3. The test enabling circuit of claim 1, wherein said plurality of insulated gate field effect transistors has a lower resistance than said resistance means, said transistors being activated in response to said test signal for providing a closed path from said power supply to said input means.

4. The test enabling circuit of claim 3, wherein said plurality of insulated gate field effect transistors are of an N-channel type connected in series with each other.

5. The test enabling circuit of claim 1, wherein said clamping means includes a bipolar transistor means having its collector coupled to said voltage supply, its base coupled to ground potential, and its emitter coupled to said nodal point.

6. The test enabling circuit of claim 1, wherein said interfacing means includes an inverter means for inverting said first and second signals for disabling and enabling said testing circuitry, respectively.

7. The test enabling circuit of claim 6, wherein said inverting means includes a complementary pair of P- and N-channel insulated gate field effect transistors with said transistor connected in series and a diode means connected between said power supply and said complementary pair of transistors for providing CMOS voltage levels at an output of said inverting means.

8. The test enabling circuit of claim 1, further comprising a voltage divider means having a second nodal point therebetween, said second nodal point being coupled to said plurality of insulated gate field effect transistors, said voltage divider means coupled between said input means and said normal operational circuit for insuring that the plurality of insulated gate field effect transistors will operate in response to said test signal.

9. In a programmable memory device having a testing circuit, a test enabling circuit connected to said testing circuit, and an input means for receiving a test signal and a normal operational signal, said testing circuit and a normal operational circuit connected at a common node to said input means, wherein said improvement is said test enabling circuit which comprises:
   a first and second resistive means forming a voltage divider means between said input means and a voltage supply with a nodal point therebetween coupled to said testing circuit for providing a first signal at said nodal point in response to said operational signal without voltage division and a second signal at said nodal point in response to a single said test signal with voltage division, wherein said first resistive means is of a higher value than said second resistive means; and
   a clamping means to said nodal point for preventing said second signal from exceeding a specified potential.

10. The test enabling circuit of claim 9, wherein said second resistive means is coupled between said nodal point and said input means, said resistive means including a plurality of insulated gate field effect transistors for preventing said voltage division in response to said normal operational signal and for allowing said voltage division in response to said test signal.

11. The test enabling circuit of claim 10, wherein said plurality of insulated gate field effect transistors are of an N-channel type.

12. The test enabling circuit of claim 11, wherein said first resistive means is coupled between said voltage supply and said nodal point, said resistive means includes an N-channel insulated gate field effect transistor having its drain connected to said voltage supply and its gate and source connected to said nodal point.

13. The test enabling circuit of claim 12, wherein said clamping means includes a bipolar transistor means having its collector coupled to said voltage supply, its base coupled to ground potential, and its emitter coupled to said nodal point.

14. The test enabling circuit of claim 13, further comprising an interfacing means connected between said nodal point and said testing circuit for providing a disable and enable signal for said testing circuit in response to said first and second signals, respectively.

15. The test enabling circuit of claim 14, wherein said interfacing means includes a complementary pair of P-channel and N-channel insulated gate field effect transistors with said transistors connected in series, and a diode means connected between said power supply and said complementary pair transistors for providing CMOS voltage levels of output.

16. The test enabling circuit of claim 15, further comprising a second voltage divider having a second nodal point therebetween, said nodal point being coupled to said second means, said voltage divider is coupled between said input means and said normal operational circuit for insuring that said second means will operate in response to said test signal.

17. In a programmable memory device having a test enabling circuit and a normal operational circuit sharing a common node, an input means for receiving a test signal and a normal operational signal, said normal operation circuit having an input protection circuit for protecting said operational circuit from electrostatic discharge (ESD), the improvement being said input protection circuit which comprises:
 a first diode means connected between a power supply and a nodal point for providing a sink for positive ESD;
 a second diode means connected between a ground potential and said nodal point for providing a sink for negative ESD;
 a third diode means having a reverse breakdown voltage equivalent to a magnitude of said test signal, said third diode means being connected between said nodal point and said second diode means for preventing current from flowing through said second diode means to said input means when said test signal is applied to said input means.

18. The input protection circuit of claim 17, wherein:
 said first diode means is formed from an NPN transistor having its collector and emitter coupled to said supply and its base to said nodal point;
 said second diode means is formed from an NPN transistor having its base coupled to ground potential, its collector coupled to said supply and its emitter coupled to said third diode means; and
 said third diode is formed from an NPN transistor having its base connected to said nodal point, its collector to said supply and its emitter to said emitter of said NPN transistor forming said second diode means.

* * * * *